US008421814B2

(12) United States Patent
Kim

(10) Patent No.: US 8,421,814 B2
(45) Date of Patent: Apr. 16, 2013

(54) DISPLAY DEVICE AND METHOD OF DRIVING THE SAME

(75) Inventor: Hyun-Sook Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 668 days.

(21) Appl. No.: 12/645,096

(22) Filed: Dec. 22, 2009

(65) Prior Publication Data

US 2010/0171751 A1 Jul. 8, 2010

(30) Foreign Application Priority Data

Jan. 8, 2009 (KR) ........................ 10-2009-0001580

(51) Int. Cl.

| | |
|---|---|
| ***G09G 3/30*** | (2006.01) |
| ***G09G 5/00*** | (2006.01) |
| ***G09G 5/02*** | (2006.01) |
| ***H04N 17/00*** | (2006.01) |
| ***H04N 5/202*** | (2006.01) |
| ***H04N 5/21*** | (2006.01) |
| ***H04N 5/57*** | (2006.01) |
| ***H04N 1/46*** | (2006.01) |
| ***G03F 3/08*** | (2006.01) |
| ***G06K 9/00*** | (2006.01) |
| ***G06K 9/40*** | (2006.01) |
| ***G06K 9/54*** | (2006.01) |

(52) U.S. Cl.

USPC ........... 345/589; 345/690; 345/593; 345/619; 345/606; 345/77; 348/180; 348/254; 348/630; 348/687; 358/504; 358/518; 358/521; 358/523; 358/525; 382/162; 382/167; 382/254; 382/274; 382/305

(58) Field of Classification Search .................. 345/426, 345/581, 589–591, 593–594, 597, 600–601, 345/606, 617–619, 547–549, 204, 207, 690, 345/211, 48, 63, 76–77, 84, 87–89; 348/179–180, 348/254, 571, 602–603, 630–631, 687, 708, 348/716–717; 358/504, 509, 512, 516, 518–521, 358/523, 525, 447–448, 461; 382/162, 167, 382/254, 274, 276, 305, 312

See application file for complete search history.

(56) References Cited

U.S. PATENT DOCUMENTS

2006/0034349 A1* 2/2006 Muranaka et al. ............ 375/142
2007/0080905 A1* 4/2007 Takahara ........................ 345/76
2007/0152934 A1* 7/2007 Maeda ............................ 345/92
2008/0181623 A1* 7/2008 Hasegawa ....................... 399/13
2008/0238837 A1 10/2008 Yamaguchi

FOREIGN PATENT DOCUMENTS

CN 101308649 A 11/2008
JP 2000-250455 9/2000

(Continued)

OTHER PUBLICATIONS

European Search Report dated Jun. 18, 2010, for corresponding European Patent application 10250025.3.

*Primary Examiner* — Wesner Sajous

(74) *Attorney, Agent, or Firm* — Christie, Parker & Hale, LLP

(57) ABSTRACT

A display device capable of displaying an image selected by a user for a certain period of time without interruption even when power consumption to be used to completely display the image exceeds a remaining capacity of a battery, and a method of driving the same. The display device includes a storage element; a selection circuit configured to select an image stored in the storage element according to a user request; a battery; a first detection circuit configured to detect a remaining capacity of the battery; a controller; and a display panel coupled to the battery via the controller and configured to display the selected image in accordance with a control output of the controller.

14 Claims, 2 Drawing Sheets

FOREIGN PATENT DOCUMENTS

| | | |
|---|---|---|
| JP | 2004-280108 | 10/2004 |
| JP | 2005-345678 | 12/2005 |
| JP | 2006-033321 | 2/2006 |
| JP | 2007-156130 | 6/2007 |
| JP | 2008-203481 | 9/2008 |
| JP | 2008-252185 | 10/2008 |
| KR | 1020040033201 | 4/2004 |

* cited by examiner

DISPLAY DEVICE AND METHOD OF DRIVING THE SAME

CROSS-REFERENCE TO RELATED APPLICATION

This application claims priority to and the benefit of Korean Patent Application No. 10-2009-0001580, filed Jan. 8, 2009, the entire content of which is incorporated herein by reference.

BACKGROUND OF THE INVENTION

1. Field of the Invention

The present invention relates to a display device for displaying an image utilizing a battery and a method of driving the same, and more particularly, to a display device capable of displaying a user-selected image for a desired period of time without interruption of the image even when power consumption exceeds a remaining capacity of the battery, and a method of driving the same.

2. Description of the Related Art

Since flat panel display devices are lightweight and thin, they are used as substitutes for cathode-ray tube display devices. Examples of the flat panel display device include liquid crystal display (LCD) devices, and organic light emitting diode (OLED) display devices. Among these, the OLED display devices have high brightness and a wide viewing angle. In addition, since the OLED display devices do not need a back light, the OLED display devices can be implemented as ultra-thin display devices.

The flat panel display device has been generally applied to compact and lightweight hand-held electric/electronic devices such as cellular phones, notebook computers and camcorders, and these electric/electronic devices include a battery capable of being operated in places in which there is no power source.

However, the display device displaying an image utilizing a battery such as the hand-held electric/electronic device may interrupt the display of a user-selected image stored in a storage element for a certain period of time when a remaining capacity of the battery is less than power needed to display the image for the certain period of time.

SUMMARY OF THE INVENTION

Aspects of the present invention are directed toward a display device capable of displaying a user-selected image for a period of time without interruption regardless of a remaining capacity of a battery and a method of driving the same.

According to an embodiment of the present invention, a display device includes: a storage element; a selection circuit configured to select an image stored in the storage element according to a user request; a first detection circuit configured to estimate power consumption for displaying the selected image; a second detection circuit configured to detect a remaining capacity of a battery; a comparison circuit configured to compare outputs of the first and second detection circuits and to provide a comparison output in accordance with the compared outputs of the first and second circuits; a brightness setting circuit configured to output red, green and blue conversion signals to set a brightness of the selected image according to the comparison output of the comparison circuit; a control circuit configured to change a brightness of an image signal of the selected image in accordance with the red, green and blue conversion signals and to provide a control output; and a display panel configured to display the selected image in accordance with the control output of the control circuit.

In one embodiment, the brightness setting circuit includes a setting circuit for outputting a first setting signal to control the brightness of the selected image according to the comparison output of the comparison circuit, a red conversion circuit for outputting the red conversion signal to set red gradation of the selected image in response to the first setting signal, a green conversion circuit for outputting the green conversion signal to set green gradation of the image in response to the first setting signal, and a blue conversion circuit for outputting the blue conversion signal to set blue gradation of the image in response to the first setting signal.

According to another embodiment of the present invention, a method of driving a display device includes: selecting an image stored in a storage element according to a user request; estimating power consumption utilized to display the selected image; detecting a remaining capacity of a battery; comparing the estimated power consumption with the remaining capacity of the battery; generating a first setting signal to set a brightness of the selected image according to the remaining capacity of the battery when the estimated power consumption exceeds the remaining capacity of the battery; generating red, green and blue conversion signals to control red, green and blue gradations of the selected image in response to the first setting signal; converting an image signal of the selected image in response to the red, green and blue conversion signals; and displaying the selected image in response to the converted image signal.

Additional aspects and/or embodiments of the invention will be set forth in part in the description which follows, but the present invention is not limited to the disclosed aspects and/or embodiments.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
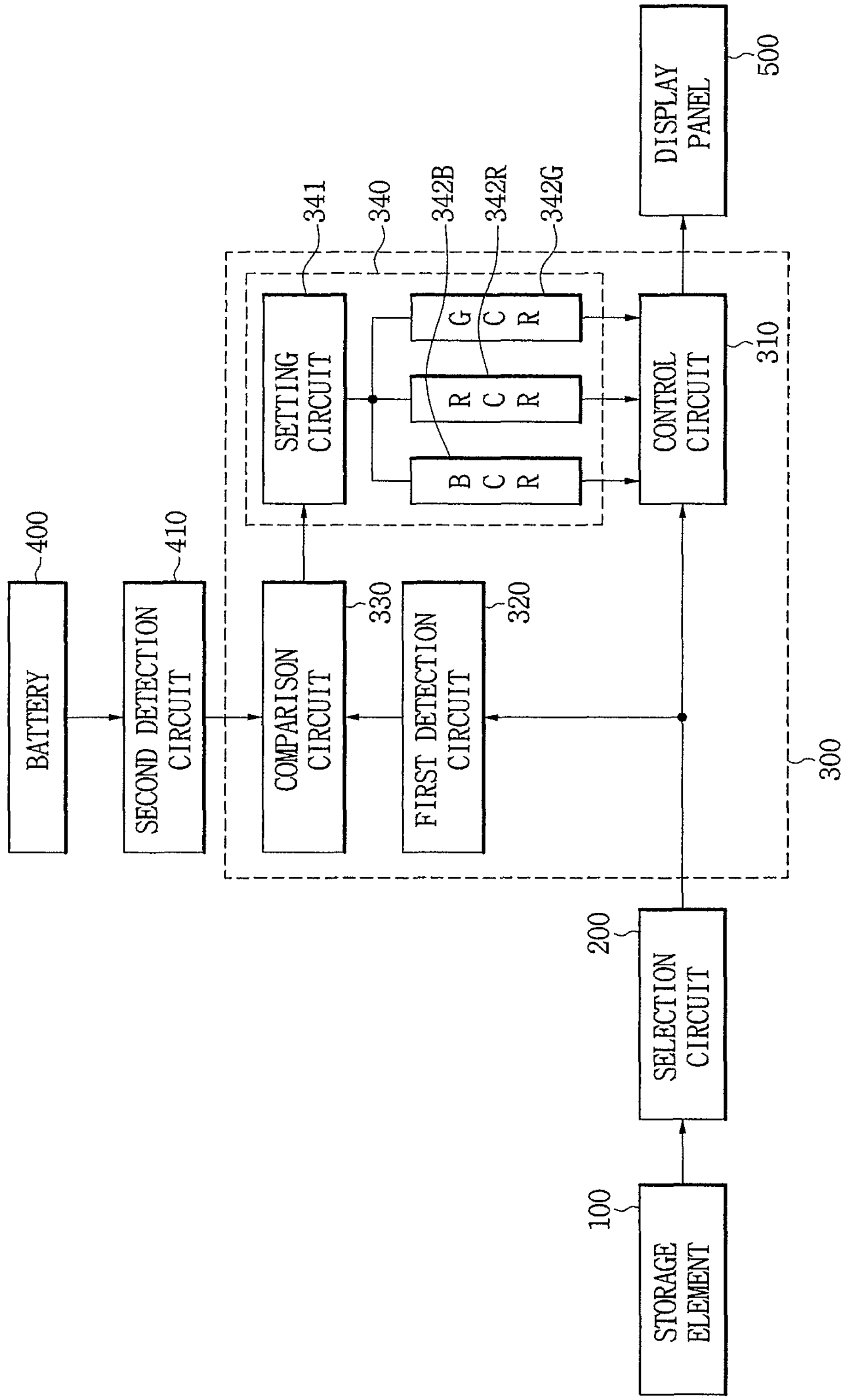
FIG. 1 is a schematic view of a display device according to an exemplary embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a schematic view of a display device according to an exemplary embodiment of the present invention.

Referring to FIG. 1, the display device according to an exemplary embodiment of the present invention includes a storage element 100, a selection circuit 200 configured to select all or part of one, some or all of the images stored in the storage element 100 according to a request of a user, a battery 400, a controller 300 including a first detection circuit 320 configured to detect and/or analyze the image(s) selected by the selection circuit and estimate power consumption for displaying the image(s) selected by the selection circuit 200 and a control circuit 310 configured to control an image signal of the image(s) according to the estimated power consumption and a remaining capacity of the battery, a display panel 500 configured to display the image(s) in response to the image signal controlled by the controller 300, and a second detection circuit 410 for detecting the remaining capacity of the battery 400 and outputting the result to the controller 300.

Here, the controller 300 includes a comparison circuit 330 configured to compare outputs of the first and second detection circuits 320 and 410, and a brightness setting circuit 340 configured to output red, green and blue conversion signals according to the output of the comparison circuit 330. The brightness setting circuit 340 includes a setting circuit 341 for outputting a first setting signal for setting a brightness of the image(s) selected by the selection circuit 200 in response to the output of the comparison circuit 330, a red conversion circuit (RCR) 342R for outputting a red conversion signal for setting red gradation of the image(s) in response to the first setting signal, a green conversion circuit (GCR) 342G for outputting a green conversion signal for setting green gradation of the image(s) in response to the first setting signal, and a blue conversion circuit (BCR) 342B for outputting a blue conversion signal for setting blue gradation of the image(s) in response to the first setting signal.

Further, the display panel 500 may be an organic light emitting diode (OLED) display device including a plurality of red, green and blue organic light emitting diodes (OLEDs).

Figure 2:
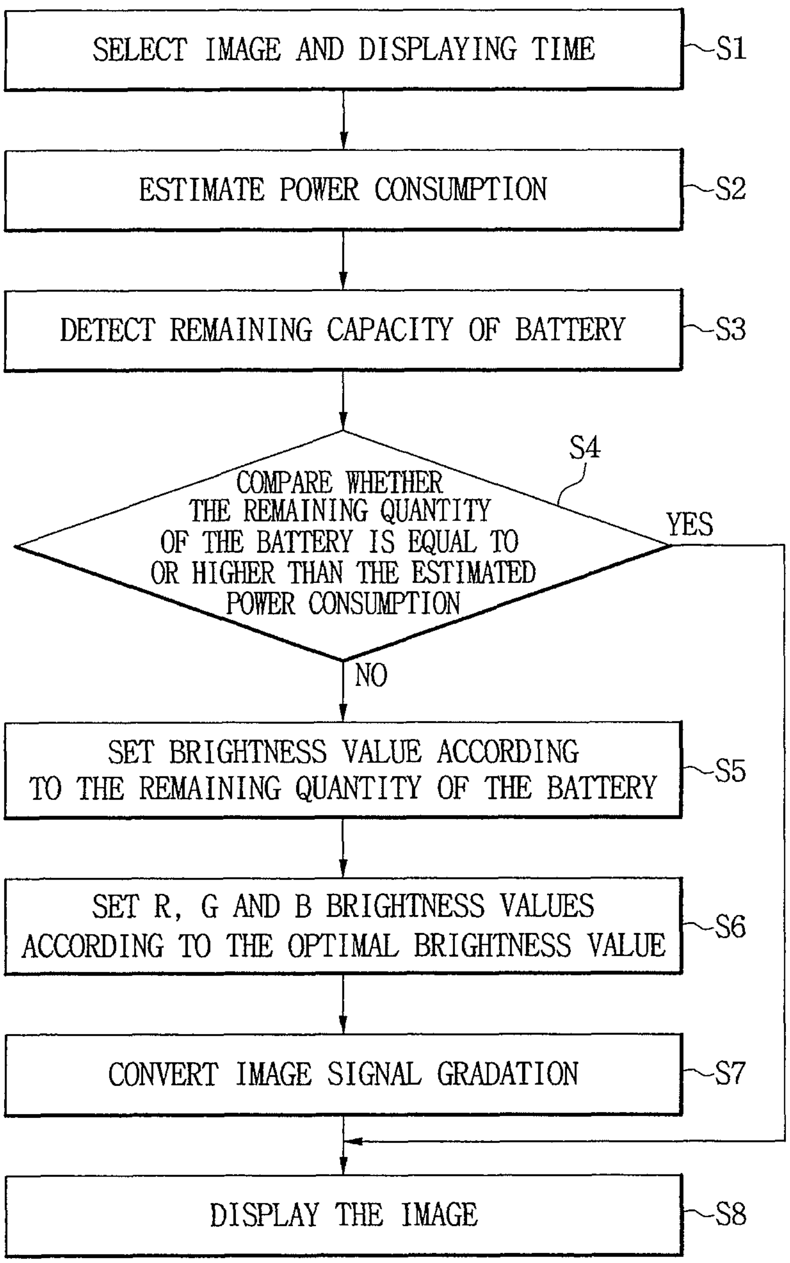
FIG. 2 is a flowchart illustrating a driving sequence of the display device according to an exemplary embodiment of the present invention.

FIG. 2 is a flowchart illustrating a driving sequence of the display device according to an exemplary embodiment of the present invention.

Referring to FIGS. 1 and 2, in the display device according to the exemplary embodiment of the present invention, when a user's request for a specific image (or images) to be displayed for a certain period of time is input, the selection circuit 200 selects all or a part of the image (or select some or all of the images) stored in the storage element 100 according to the user's request (S1), and an image signal of the image is input to the controller 300.

Subsequently, in the controller 300, the first detection circuit 320 analyzes and/or detects the image signal of the image to estimate power consumption taken to display the image (S2). Next, the signal for the remaining capacity of the battery 400 is received from the second detection circuit 410 for detecting the remaining capacity of the battery 400 (S3).

Here, the first detection circuit 320 estimates power consumption of the selected image for a short period of time by extracting a specific order of image from each frame of the selected image, and estimates the required currents from the extracted images.

More specifically, a brightness of a red pixel is estimated by the following equation (1) using a white brightness $W_B$ detected from each image, and brightness of green and blue pixels are detected by the same (or substantially the same) method as described above.

$$R_L = [R_{LR} \times W_B] \times \frac{1}{R_A} \times \frac{1}{T} \times 3 \qquad \text{Equation (1)}$$

Herein, $R_L$ is a brightness of a red pixel, $R_{LR}$ is a brightness ratio of the red pixel, $R_A$ is an aperture ratio of the red pixel, and T is a transmittance of the display device.

Next, power consumptions of the red, green and blue pixels from each image are detected using the following equation (2), to thereby estimate power consumption from the image.

$$R_C = \frac{R_L}{R_E} \times R_n \times \text{Aperture Ratio} \qquad \text{Equation (2)}$$

Herein, $R_C$ is the estimated power consumption of the red pixel, $R_E$ is emission efficiency of the red pixel, and $R_n$ is the number of the red pixels of each image.

Subsequently, the comparison circuit 330 compares the outputs of the first and second detection circuits 320 and 410, and then the controller 300 determines if the remaining capacity of the battery 400 is equal to or higher than the estimated power consumption (S4).

When the estimated power consumption is higher than the remaining capacity of the battery 400, in order to completely display the selected image using the remaining capacity of the battery 400, in the brightness setting circuit 340, the setting circuit 341 outputs the first setting signal to set the brightness of the image (S5), and the red, green and blue conversion circuits 342R, 342G and 342B generate red, green and blue conversion signals to set the red, green and blue gradations of the image in response to the first setting signal, respectively (S6).

Here, the first setting signal indicates a set brightness of white $W_{SL}$ of each image detected by the following equation (3), and the red, green and blue conversion circuits 342R, 342G and 342B output a difference between the red, green and blue brightness according to the set brightness of white determined by the following equation (3) and the red, green and blue brightnesses of the selected image as the red, green and blue conversion signals using the equations (1) and (2).

$$W_{SL} = \frac{C_2}{C_1} \times W_B \qquad \text{Equation (3)}$$

Herein, $C_1$ is the estimated power consumption estimated by the first detection circuit, and $C_2$ is the remaining capacity of the battery detected by the second detection circuit.

When the display panel is an OLED display device including red, green and blue OLEDs, as different power consumptions are respectively applied to the red, green and blue OLEDs to obtain an equal brightness, the power applied to the red, green and blue pixels is reduced according to a ratio of the estimated power consumption and the remaining capacity of the battery to reduce the brightness of the selected image. Here, a white balance of the image displayed on the display panel is changed (not properly balanced), resulting in poor displaying quality of the image.

Thus, as described in the embodiment of the present invention, when the white brightness of the image is reset according to the ratio of the estimated power consumption and the remaining capacity of the battery, and the power applied to the red, green and blue pixels is reduced according to the reset white brightness; the white balance of the image displayed on the display panel is properly balanced and the display quality of the image displayed on the display panel 500 is not degraded due to the resetting of the white balance.

Subsequently, the control circuit 310 converts an image signal received from the selected circuit 200 in response to the received red, green and blue conversion signals (S7), and then outputs the image signal to the display panel 500, so as to display the image having the brightness set by the brightness setting circuit 340.

As a result, when the estimated power consumption utilized to display the image requested by the user exceeds the remaining capacity of the battery, that is, the remaining capacity of the battery is not sufficient, the display device according to the embodiment of the present invention converts red, green and blue gradations of the selected image and thus controls a brightness of the image in order to display the image without interruption and change in display.

According to the present invention, to display a specific image selected by a user for a certain period of time, a display device estimates power consumption to complete the display of the image for the certain period of time, detects a remaining capacity of a battery, and reduces a brightness of the image according to the remaining capacity of the battery when the estimated power consumption exceeds the remaining capacity of the battery. Thus, the user-selected image can be completely displayed for the certain period of time without interruption.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device, comprising:

a storage element;

a selection circuit configured to select an image stored in the storage element according to a user request;

a first detection circuit configured to estimate power consumption for displaying the selected image;

a second detection circuit configured to detect a remaining capacity of a battery;

a comparison circuit configured to compare outputs of the first and second detection circuits and to provide a comparison output in accordance with the compared outputs of the first and second circuits, the comparison output indicating whether the remaining capacity of the battery is equal to or higher than the estimated power consumption;

a brightness setting circuit configured to output red, green and blue conversion signals to set a brightness of the selected image according to the comparison output of the comparison circuit, wherein the brightness setting circuit is configured to generate a first setting signal by utilizing a ratio of the estimated power consumption and the remaining capacity of the battery;

a control circuit configured to change a brightness of an image signal of the selected image when the comparison output indicates that the estimated power consumption is higher than the remaining capacity of the battery, in accordance with the red, green and blue conversion signals and to provide a control output; and a display panel configured to display the selected image in accordance with the control output of the control circuit.

2. The display device according to claim 1, wherein the first detection circuit is configured to estimate the power consumption of the selected image by utilizing the following equations (1) and (2):

$$R_L = [R_{LR} \times W_B] \times \frac{1}{R_A} \times \frac{1}{T} \times 3 \qquad \text{Equation (1)}$$

$$R_C = \frac{R_L}{R_E} \times R_n \times \text{Aperture Ratio} \qquad \text{Equation (2)}$$

wherein, $R_L$ is a brightness of a red, green or blue pixel, $R_{LR}$ is a brightness ratio of the red, green or blue pixel, $R_A$ is an aperture ratio of the red, green or blue pixel, T is a transmittance of the display device, $R_C$ is the estimated power consumption of the red, green or blue pixel, $R_E$ is an emission efficiency of the red, green or blue pixel, and $R_n$ is the number of the red, green or blue pixels of the selected image.

3. The display device according to claim 1, wherein the brightness setting circuit comprises a setting circuit for outputting the first setting signal to control the brightness of the selected image according to the comparison output of the comparison circuit, a red conversion circuit for outputting the red conversion signal to set red gradation of the selected image in response to the first setting signal, a green conversion circuit for outputting the green conversion signal to set green gradation of the image in response to the first setting signal, and a blue conversion circuit for outputting the blue conversion signal to set blue gradation of the image in response to the first setting signal.

4. The display device according to claim 3, wherein the setting circuit generates the first setting signal by utilizing the following equation (3):

$$W_{SL} = \frac{C_2}{C_1} \times W_B, \qquad \text{Equation (3)}$$

wherein, $W_{SL}$ is the first setting signal, $W_B$ is a white brightness of the selected image, $C_1$ is the estimated power consumption estimated by the first detection circuit, and $C_2$ is the remaining capacity of the battery detected by the second detection circuit.

5. The display device according to claim 1, wherein the display panel is an organic light emitting diode (OLED) display device comprising a plurality of OLEDs.

6. A method of driving a display device, comprising:

selecting an image stored in a storage element according to a user request;

estimating power consumption utilized to display the selected image;

detecting a remaining capacity of a battery;

comparing the estimated power consumption with the remaining capacity of the battery to determine whether the remaining capacity of the battery is equal to or higher than the estimated power consumption;

generating a first setting signal according to a ratio of the estimated power consumption and the remaining capacity of the battery, to set a brightness of the selected image according to the remaining capacity of the battery when the estimated power consumption exceeds the remaining capacity of the battery;

generating red, green and blue conversion signals to control red, green and blue gradations of the selected image in response to the first setting signal;

converting an image signal of the selected image in response to the red, green and blue conversion signals; and displaying the selected image in response to the converted image signal.

7. The method according to claim 6, wherein the estimated power consumption is estimated by utilizing the following equations (1) and (2):

$$R_L = [R_{LR} \times W_B] \times \frac{1}{R_A} \times \frac{1}{T} \times 3 \qquad \text{Equation (1)}$$

$$R_C = \frac{R_L}{R_E} \times R_n \times \text{Aperture Ratio} \qquad \text{Equation (2)}$$

wherein, $R_L$ is a brightness of a red, green or blue pixel, $R_{LR}$ is a brightness ratio of the red, green or blue pixel, $R_A$ is an aperture ratio of the red, green or blue pixel, T is a transmittance of the display device, $R_C$ is the estimated power consumption of the red, green or blue pixel, $R_E$ is an emission efficiency of the red pixel, and $R_n$ is the number of the red, green or blue pixels of the selected image.

8. The method according to claim 6, wherein the first setting signal is generated using the following equation (3):

$$W_{SL} = \frac{C_2}{C_1} \times W_B, \qquad \text{Equation (3)}$$

wherein, $W_{SL}$ is the first setting signal, $W_B$ is a white brightness of the selected image, $C_1$ is the estimated power consumption detected by a first detection circuit, and $C_2$ is the remaining capacity of the battery detected by a second detection circuit.

9. The method according to claim 6, wherein the image in response to the converted image signal is displayed on an OLED display device comprising a plurality of OLEDs.

10. A display device, comprising:

a storage element;

a selection circuit configured to select an image stored in the storage element according to a user request;

a battery;

a first detection circuit configured to detect a remaining capacity of the battery;

a controller; and a display panel coupled to the battery via the controller and configured to display the selected image in accordance with a control output of the controller, the controller comprising:

a second detection circuit configured to estimate power consumption for displaying the selected image;

a comparison circuit configured to compare outputs of the first and second detection circuits and to provide a comparison output in accordance with the compared outputs of the first and second circuits, the comparison output indicating whether the remaining capacity of the battery is equal to or higher than the estimated power consumption;

a brightness setting circuit configured to output red, green and blue conversion signals to set a brightness of the selected image according to the comparison output of the comparison circuit, wherein the brightness setting circuit is configured to generate a first setting signal by utilizing a ratio of the estimated power consumption and the remaining capacity of the battery; and a control circuit configured to change a brightness of an image signal of the selected image when the comparison output indicates that the estimated power consumption is higher than the remaining capacity of the battery, in accordance with the red, green and blue conversion signals and to provide the control output.

11. The display device according to claim 10, wherein the second detection circuit is configured to estimate the power consumption of the selected image by utilizing the following equations (1) and (2):

$$R_L = [R_{LR} \times W_B] \times \frac{1}{R_A} \times \frac{1}{T} \times 3 \qquad \text{Equation (1)}$$

$$R_C = \frac{R_L}{R_E} \times R_n \times \text{Aperture Ratio} \qquad \text{Equation (2)}$$

wherein, $R_L$ is a brightness of a red, green or blue pixel, $R_{LR}$ is a brightness ratio of the red, green or blue pixel, $R_A$ is an aperture ratio of the red, green or blue pixel, T is a transmittance of the display device, $R_C$ is the estimated power consumption of the red, green or blue pixel, $R_E$ is an emission efficiency of the red, green or blue pixel, and $R_n$ is the number of the red, green or blue pixels of the selected image.

12. The display device according to claim 10, wherein the brightness setting circuit comprises a setting circuit for outputting the first setting signal to control the brightness of the selected image according to the comparison output of the comparison circuit, a red conversion circuit for outputting the red conversion signal to set red gradation of the selected image in response to the first setting signal, a green conversion circuit for outputting the green conversion signal to set green gradation of the image in response to the first setting signal, and a blue conversion circuit for outputting the blue conversion signal to set blue gradation of the image in response to the first setting signal.

13. The display device according to claim 12, wherein the setting circuit generates the first setting signal by utilizing the following equation (3):

$$W_{SL} = \frac{C_2}{C_1} \times W_B, \qquad \text{Equation (3)}$$

wherein, $W_{SL}$ is the first setting signal, $W_B$ is a white brightness of the selected image, $C_1$ is the estimated power consumption estimated by the first detection circuit, and $C_2$ is the remaining capacity of the battery detected by the second detection circuit.

14. The display device according to claim 10, wherein the display panel is an organic light emitting diode (OLED) display device comprising a plurality of OLEDs.

* * * * *